United States Patent [19]
Dent

[11] Patent Number: 6,091,303
[45] Date of Patent: Jul. 18, 2000

[54] METHOD AND APPARATUS FOR REDUCING OSCILLATOR NOISE BY NOISE-FEEDFORWARD

[75] Inventor: Paul W. Dent, Pittsboro, N.C.

[73] Assignee: Ericsson Inc., Research Triangle Park, N.C.

[21] Appl. No.: 09/286,857

[22] Filed: Apr. 6, 1999

[51] Int. Cl.[7] .............................. H03C 1/00; H03C 3/00; H03L 7/07; H03L 7/16; H04L 27/00
[52] U.S. Cl. ................................. 331/2; 331/16; 331/17; 331/18; 331/23; 327/147; 332/103; 332/159; 332/161; 332/170; 375/376; 375/296; 375/298; 375/308; 455/260
[58] Field of Search ................................. 331/2, 16, 17, 331/18, 23, 25; 327/147–150, 156–159; 375/376, 296, 298, 308; 455/260; 332/103–105, 170, 159, 161

[56] References Cited

U.S. PATENT DOCUMENTS

| | | |
|---|---|---|
| 5,095,288 | 3/1992 | Dent . |
| 5,530,722 | 6/1996 | Dent . |
| 5,535,432 | 7/1996 | Dent . |
| 5,654,677 | 8/1997 | Dent . |
| 5,737,694 | 4/1998 | McMahill et al. ................. 455/76 |

*Primary Examiner*—David Mis
*Attorney, Agent, or Firm*—Wood, Phillips, VanSanten, Clark & Mortimer

[57] ABSTRACT

A circuit for reducing phase noise in a transmitted radio signal includes a first phase-locked loop circuit including a first controlled oscillator generating a first output signal at a first desired frequency, and a first phase comparator developing a first phase error signal to control the first controlled oscillator, the first error signal representative of phase differences between the first output signal and the first desired frequency. A second phase-locked loop circuit includes a second controlled oscillator generating a second output signal at a desired frequency of transmission related to the first desired frequency, and a second phase comparator developing a second phase error signal representative of phase differences between the first output signal and the desired frequency of transmission. A summer combines the first and second error signals to control the second controlled oscillator to thereby reduce, or cancel, phase noise generated by the first controlled oscillator in the second output signal transmitted as a radio signal at the desired frequency of transmission.

33 Claims, 2 Drawing Sheets

METHOD AND APPARATUS FOR REDUCING OSCILLATOR NOISE BY NOISE-FEEDFORWARD

FIELD OF THE INVENTION

The present invention is directed toward reducing phase noise in radio systems and, more particularly, toward integrating oscillators into silicon chips while achieving a reduction of phase noise in the radio systems in which the integrated oscillators are utilized.

BACKGROUND OF THE INVENTION

U.S. application Ser. No. 08/730,670, entitled "Dual Mode GSM/AMPS Phones" filed Oct. 11, 1996, which is hereby incorporated by reference herein, describes various circuit architectures utilized in portable cellular telephones in which a desired transmit signal at a desired transmit frequency is produced by first modulating a transmit intermediate frequency voltage controlled oscillator (TXIF-VCO). The disclosed TXIF-VCO is preferably of the type known as a Quadrature VCO (QVCO), which produces two quadrature output signals 90° out of phase with each other (Cosine and Sine). The quadrature output signals are received by a quadrature modulator, such as the improved quadrature modulator described in U.S. Pat. No. 5,530,722 issued Jun. 25, 1996, also hereby incorporated by reference herein.

The modulated TXIF-QVCO signal from the quadrature modulator is then compared in a phase comparator with a signal from a transmit final-frequency voltage controlled oscillator (TX-VCO). Prior to the comparison, the TX-VCO signal is mixed down to equal the frequency of the TXIF-QVCO signal by heterodyne mixing with a signal from a frequency synthesizer, the latter signal normally being available from the receiver where the frequency synthesizer is used as the receiver local oscillator (RXLO). An error signal is output by the phase comparator when the phases of the signals input thereto are not equal. The error signal is passed through a loop, or low pass, filter and is used to control, or tune, the TX-VCO to the desired transmit frequency, which is equal to the sum or difference of the RXLO and TXIF signal frequencies. The control loop bandwidth of the loop filter is made sufficiently wide to pass the phase modulation applied by the quadrature modulator to the TXIF-QVCO signal, and thus apply the same phase modulation to the TX-VCO, thus obtaining a modulated final-frequency transmit signal.

The above-described prior art system has been integrated into RF (Radio Frequency) integrated circuits and is used in cellular phones conforming to GSM (Global System for Mobile Communications) standards, as well as in cellular phones conforming to the PCS1900 standard.

If the TXIF-QVCO signal is a small multiple of the crystal reference oscillator frequency, as deliberately arranged in the GSM/PCS1900 circuits, the TXIF-QVCO frequency only need be frequency divided by that small multiple in order to reduce the frequency of the TXIF-QVCO signal to that of the crystal reference oscillator for phase comparison. It is well known that the phase noise of an oscillator controlled by a phase-locked loop circuit (PLL) is dependent on the frequency divider ratio, and is worse when the frequency divider ratio is large. In the aforementioned applications, the small divider ratio results in acceptably low phase noise, allowing the TXIF-QVCO to be of a multivibrator type, which may be easily integrated into a silicon integrated circuit. A suitable type of multivibrator is, for example, an emitter-coupled or source-coupled current-controlled multivibrator, based on either bipolar or field-effect transistors, respectively. An example of such a multivibrator is described in U.S. Pat. No. 5,654,677 issued Aug. 5, 1997, which is hereby incorporated by reference herein.

In other applications, it may not be possible to devise an internal frequency scheme such that the TXIF-QVCO frequency is a small multiple of the crystal reference oscillator frequency. This situation can arise when, for example, the transmitter channels are desired to be selectable with a finer step size than the receiver channels, as described in U.S. application Ser. No. 08/746,338, entitled "Satellite/Cellular Phone Using Different Channel Spacings on the Forward and Return Links" filed Nov. 8, 1996. This application and its parent, U.S. Pat. No. 5,535,432 issued Jul. 9, 1996, are hereby incorporated by reference herein. This results in a higher division ratio used in the TXIF-QVCO phase-locked loop circuit, which in turn results in higher phase noise.

The present invention is directed toward overcoming the above-mentioned problems, namely, alleviating the deleterious affects of higher TXIF-QVCO phase noise.

SUMMARY OF THE INVENTION

An oscillator capable of being controlled in frequency by a control signal can be manufactured in any of a number of ways. In cellular technology, to reduce size and cost, the preferred way is by integration into a silicon integrated circuit. While oscillator phase noise may be reduced by employing high-Q resonators to define the oscillator operating frequency, high-Q resonators are difficult to produce in an integrated circuit since they are spaced from the lossy silicon substrate by only a few microns, and the proximity of the lossy silicon substrate reduces the Q. On the other hand, an integrated circuit oscillator having a low-Q resonator which are capable of being produced in an integrated circuit, or else an oscillator that does not require a resonant circuit, such as a multivibrator oscillator, exhibits high phase noise which is undesirable in certain system applications.

According to a general implementation of the present invention, there is provided a circuit including a first phase comparator for comparing the phase of a first controlled oscillator signal from a first controlled oscillator with the phase of a reference oscillator frequency signal derived from a low-noise reference oscillator, such as a crystal oscillator. Prior to the comparison, both oscillator signals are reduced to a common comparison frequency by means of suitable frequency divider circuits. The first phase comparator outputs an error signal when the oscillator signals do not have the same phase. A first loop filter, including an integrator circuit, filters the error signal from the first phase comparator to produce a control signal to the first controlled oscillator such that its frequency is controlled to a desired value and its phase error has a mean of zero.

The first controlled oscillator signal is then compared in a second phase comparator with a signal from a second controlled oscillator. Prior to the comparison, both signals are reduced to a common comparison frequency by frequency division or heterodyne mixing. The second phase comparator outputs an error signal when the oscillator signals do not have the same phase. The phase error signal of nominally zero mean value from the first phase comparator is then added in a summer to the phase error from the second phase comparator (the phase error signals are 180° out of phase) in such a way that phase noise of the first controlled oscillator is canceled, thereby producing a control signal for the second controlled oscillator that is free of phase noise from the first controlled oscillator. The noise free control signal is then filtered in a second loop filter and used to control the second controlled oscillator to produce a signal at a desired frequency having improved phase noise characteristics.

In a preferred embodiment of the present invention, the first phase comparator includes two identical phase comparators having the same input signals from the first controlled oscillator and the reference oscillator, respectively. One of the identical phase comparators is connected to the first loop filter to provide the control signal for the first controlled oscillator, while the other identical phase comparator is connected to the output of the second phase comparator to produce a Y-added addition of the phase error current signals. The preferred embodiment takes into account that phase comparators typically have current source outputs, and therefore, merely splitting the output of the first phase comparator would result in a current split. The noise free control signal is then filtered in the second loop filter and used to control the second controlled oscillator. In the preferred embodiment, the first and second loop filters are thereby decoupled from one another by the use of identical first phase comparators.

It is an object of the present invention to reduce phase noise in radio systems.

It is a further object of the present invention to integrate oscillators into silicon chips while achieving a reduction of phase noise.

It is yet a further object of the present invention to reduce the size, cost and power consumption of integrated oscillators.

Other aspects, objects and advantages of the present invention can be obtained from a study of the application, the drawings, and the appended claims.

DETAILED DESCRIPTION OF THE PREFERRED EMBODIMENT

Figure 1:
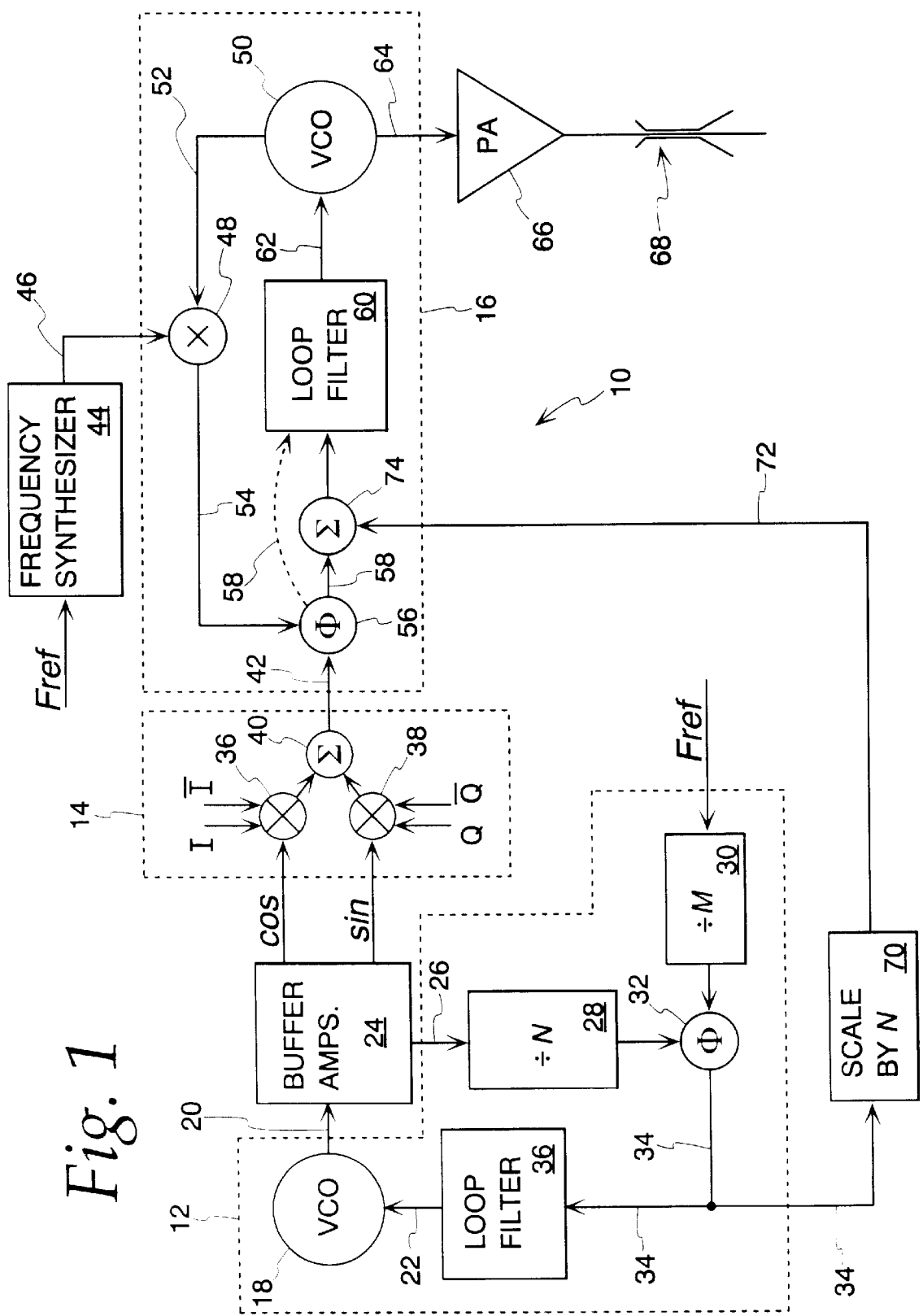
FIG. 1 is block diagram of a general implementation of the invention for reducing oscillator noise by noise-feedforward.

FIG. 1 is a block diagram of a general implementation of the inventive circuit, shown generally at 10. Through the use of a noise feed-forward loop, as will be described in greater detail hereafter, the inventive circuit 10 achieves a reduction in oscillator phase noise. Further, the inventive circuit 10 may be integrated into silicon chips, thus reducing the overall size of the circuit and its cost of manufacture. The inventive circuit 10 includes a first phase-locked loop circuit 12, a quadrature modulator 14 and a second phase-locked loop circuit 16. The first phase-locked loop circuit 12 includes a first voltage controlled oscillator (VCO) 18 which generates an output signal 20 frequency dependent on the voltage control input signal 22. Although such frequency-controllable oscillators are generally known as VCO's, this term shall be taken also to encompass current-controlled oscillators, which are another common implementation in which the frequency of the output signal depends on a control current rather than a control voltage.

The output signal 20 from the VCO 18 is buffered by buffer amplifiers 24, which can include a 90° phasing network or a Hilbert network, producing cosine and sine wave outputs that have a relative 90° phase shift with respect to each other. It is also known to construct Quadrature VCO's (QVCO's), which directly output both the cosine and sine waveforms, and such QVCO's may alternatively be used (see e.g., FIG. 2). In this implementation, the buffer amplifiers 24 are subsumed into the QVCO. Quadrature modulators and improvements thereto are described in allowed U.S. Pat. No. 5,530,722 issued Jun. 25, 1996, which is hereby incorporated by reference herein.

The buffer amplifiers 24 also provide a buffered VCO signal 26 back to the first phase-locked loop circuit 12. The buffered VCO signal 26 from the buffer amplifiers 24 is a third separately buffered output signal and can be a cosine or sine waveform having the same frequency but out of phase with the cosine and sine waveforms supplied to the quadrature modulator 14. The buffered VCO signal 26 is received at a divide-by-N circuit 28 which divides the buffered VCO signal 26 by N. A reference divide-by-M circuit 30 divides a reference signal of known frequency $F_{ref}$ to obtain $F_{ref}/M$. A phase comparator 32 compares the outputs of dividers 28 and 30 and develops an error signal 34 when the outputs of dividers 28 and 30 do not have the same frequency and phase. The error signal 34 is provided to a loop filter 36 which filters the error signal 34 and produces the control signal 22 to VCO 18 in such a way as to cause the error in the to VCO output signal 20 to reduce towards zero frequency and phase error. At that point, i.e., zero error, the VCO 18 is locked to the frequency $(N/M)F_{ref}$. Thus any desired VCO 18 frequency can be obtained, within practical limits, by suitable choice of M and N according to well known digital frequency synthesizer techniques.

The quadrature modulator 14 impresses phase and/or amplitude modulation on a signal having a mean frequency equal to the frequency of the VCO 18. In some applications, such as in cellular phones conforming to GSM (Global System for Mobile Communications) standards, only phase modulation is used. It is desired that such phase modulation shall be transferred to an output transmitter frequency chosen from one of a plurality of channels located in an allocated cellular telephone band, such as 935–960 MHz in Europe, or in the 1900 MHz PCS spectrum in the United States.

The quadrature modulator 14 includes a pair of balanced mixers 36,38 and a summer 40. The mixers 36,38 mathematically perform a multiplication of I and Q signals onto the cosine and sine waveforms generated by the buffer amplifiers 24. The I and Q signals are preferably generated by a digital signal processor (not shown) and carry modulated information, and when modulated onto a radio carrier cause amplitude and phase modulation of the radio carrier. The I signals (I and $\bar{I}$, are multiplied onto the cosine and waveform by mixer 36. Similarly, the Q signals (Q and $\bar{Q}$) are multiplied onto the sine waveform at mixer 38. The outputs of mixers 36 and 38 are added together by the summer 40 producing an amplitude/phase modulated signal 42 which is essentially a vector having an amplitude and phase. With quadrature modulation, and providing the I and Q signals are properly generated to represent the characteristics of the vector components of a particular type of modulation, various forms of modulation may be produced, e.g., binary phase shift keying, quadrature amplitude modulation, single side band speech, etc. The I and Q signals essentially determine the type of modulation to be implemented.

The desired cellular channel is conventionally selected by programming a frequency synthesizer 44, which is typically used as the local oscillator in the receiver, to generate a mixing frequency signal 46 to a downconverter 48. A second VCO 50 produces the other input signal 52 to the downconverter 48. The VCO 50 is operating directly on the transmit frequency, and is preferably a low noise VCO. The transmit frequency signal 52 is subtracted from the mixing frequency signal 46 in the downconverter 48 producing a difference frequency signal 54 which should be at the transmit offset frequency. The transmit offset is the offset that is made from the receiver frequency synthesizer 44 to produce the transmit frequency and is equal to the receiver intermediate frequency plus or minus duplex spacing. The duplex spacing is essentially a fixed gap between the uplink and downlink frequency bands enabling a cell phone, or other device, to simultaneously transmit and receive signals. For example, in the 800 MHz frequency band the duplex spacing is 45 MHz; in the 2 Gigahertz PCS band the duplex spacing is a constant 80 MHz.

The VCO 18 of the first phase-locked loop 12 is preferably operating at the transmit offset frequency. The output signal 42 from the quadrature modulator 14 is thus a modulated transmit offset frequency signal. The difference frequency signal 54 from the downconverter 48 and the modulated transmit offset frequency signal 42 are input to a phase comparator, or detector, 56, which compares the difference frequency signal 54 with the phase modulated signal 42 (both signals being at the transmit offset frequency) from the quadrature modulator 14. If the phase of the signal 52 from the VCO 50 does not equal the phase of the modulated signal 42, an error signal 58 (shown in dotted form) is produced to a loop filter 60, which in turn produces a control signal 62 to control the VCO 50 to reduce the error, thus forcing the VCO 50 to follow the phase modulation impressed by the quadrature modulator 14. The phase modulated signal 64 from the VCO 50 is then amplified by a transmit power amplifier 66 and radiated by an antenna 68, when required.

A troublesome imperfection with prior art systems is that oscillator phase noise can occur with a sufficient magnitude, compared to the intended phase modulation, to increase errors in data transmission.

Phase noise is particularly troublesome when attempts are made to reduce size and cost by manufacturing the VCO 18 as part of an integrated circuit chip embodying all of the elements (14, 18, 24, 28, 30, 32, 36, 48 and 56). Therefore the present invention incorporates additional elements or connections in order to reduce the phase noise contribution from the VCO 18.

The phase noise generated by the VCO 18, relative to the assumed noise-free reference signal $F_{ref}$, emerges from the phase comparator 32 reduced by the factor N, which is the division ratio of the divider 28. Therefore, the error signal 34 from the phase comparator 32 is scaled in a scaler 70, by a factor N for example, to obtain a signal 72 representing the phase noise of the VCO 18 in a proper magnitude. The phase noise of the VCO 18 also appears, together with the intended modulation, on the output signal 42 from the quadrature modulator 14, and is thus transferred through to the output signal 58 of the phase comparator 56. The present invention thus contemplates providing a summer 74 receiving the scaled phase noise signal 72 from the scaler 70 and the phase error signal 58 from the phase comparator 56 and adding the scaled phase noise signal 72 from the scaler 70 to the phase error signal 58 from phase comparator 56 in such a way as to cancel the phase noise generated by VCO 18. While the summer 74 performs a simple addition application, since the scaled phase noise signal 72 is out of phase with the phase error signal 58 by 180°, a subtraction, or cancellation, of the phase error results. Thus, the addition of the summer 74 reduces the amount of phase error generated by the VCO 18 that is transferred through the loop filter 60 to the VCO 50, and thus to the output of the power amplifier 66 and antenna 68. Preferably, elements 14, 18, 24, 28, 30, 32, 36, 48, 56, 70 and 74 would be implemented as part of the integrated circuit chip. The loop filter 60 may or may not be formed as part of the integrated circuit chip.

Using the inventive circuit of FIG. 1, the VCO 18 may be of a small size and low cost, without incurring the phase noise penalty generally associated with small size, low cost VCO's.

Figure 2:
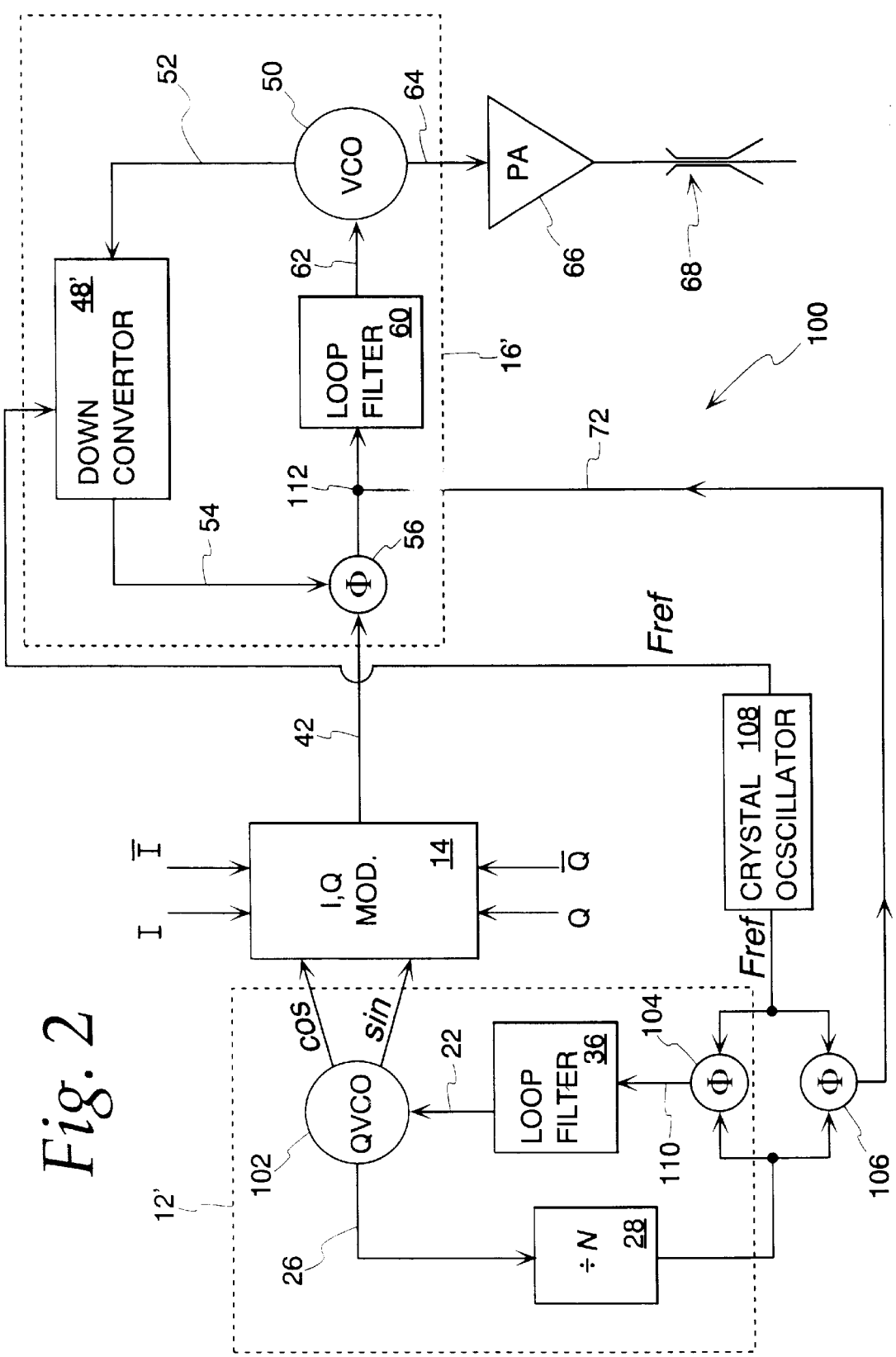
FIG. 2 is a block diagram of a preferred embodiment of the present invention for reducing oscillator noise by noise-feedforward.

FIG. 2 illustrates a preferred implementation of the inventive circuit, shown generally at 100, with like elements from FIG. 1 indicated with the same reference numbers and elements which have been modified indicated with a prime ('). A quadrature VCO (QVCO) 102 is provided in the first phase-locked loop circuit 12' replacing the VCO 18 and buffer amplifiers 24 of FIG. 1. The QVCO 102 receives the control signal 22 from the loop filter 36 and generates the cosine and sine wave forms required to drive the quadrature modulator 14. Further, identical phase comparators 104 and 106 have replaced the single phase comparator 32 of FIG. 1. The identical phase comparators 104 and 106 have the same input signals as phase comparator 32 in FIG. 1, namely, the QVCO signal 26 through divide-by-divide N circuit 28, and the reference frequency signal $F_{ref}$ from crystal reference oscillator 108. The phase comparator 104 develops an error signal 110 if the phases of the QVCO signal 26 and $F_{ref}$ signal are different. The error signal 110 is provided to the loop filter 36, which in turn produces the control signal 22 to the QVCO 102 to reduce the frequency and phase error output by the QVCO 102. Similarly, the phase comparator 106 outputs the error signal 72 representative of phase differences between the QVCO signal 26 and reference signal $F_{ref}$. Both phase comparators 104 and 106 are preferably of the form known as charge pumps, which are more fully described in, for example, U.S. Pat. No. 5,095,288 which is hereby incorporated by reference herein. The frequency synthesizer disclosed in the '288 Patent may furthermore be used as frequency synthesizer 44 in FIG. 1, or may be implemented as part of the downconverter 48' in FIG. 2. The downconverter 48' may also incorporate digital frequency dividers as well, or instead of, heterodyne downconverter, which options are however largely immaterial to the invention.

A charge pump type of phase comparator is also preferred for the phase comparator 56 in the second phase-locked loop circuit 16', although any type of phase comparator having a current source output signal proportional to phase error between the comparator input signals is suitable for use with the present invention. For example, a Gilbert Cell type of phase comparator may be used with current mirrors to convert its output to a bidirectional current source. The Gilbert Cell type of phase comparator is preferred to a digital phase comparator and charge pump for operating (input signal) frequencies higher than about 20 MHz.

The use of phase comparators with current source outputs allows the output of phase comparators 56 and 106 to be merely connected in parallel at node 112 to achieve addition of their output current signals. The reason for the duplicate phase comparators 104 and 106 is that they avoid the need to connect the output of phase comparators 104 and 56 together, which would cause unwanted interaction between the first phase-locked loop circuit (28, 36, 102, 104) controlling the QVCO 102 and the second phase-locked loop circuit (48',50,56,60) controlling the VCO 50. The provision of the separate phase comparator 106, otherwise identical or similar to the phase comparator 104, thus provides a duplicate but isolated output of the same phase error current signal as exists at the output of phase comparator 104. The phase comparator 106 preferably directly provides a phase noise current scaled up by a factor 'N' compared to the phase noise current from phase comparator 56, thus compensating for the division-by-N in the divider circuit 28. This scaling may be achieved by proper choice of the operating currents of charge pump or Gilbert Cell type of phase comparators, which can be set to a sufficient accuracy without further adjustment while still achieving useful amounts of phase noise compensation. If however the divide-by-N circuit 28 is a variable divider that is operated at different values, as may be necessary for transmitters that operate in alternate cellular bands such as 800 MHz and 1900 MHz, then the amount of scaling for proper noise compensation may have to be adjusted. The '288 Patent incorporated herein, discloses how to construct charge pump phase comparators having programmable current levels, which are suitable for producing variable scaling, if needed.

It has been described above how the addition of a minor amount of additional circuitry, such as a duplicate charge pump phase comparator 106 in FIG. 2, and a scaler 70 and summer 74 in FIG. 1, can compensate for phase noise from a QVCO 102 or a VCO 18 when used to perform modulation at a transmit intermediate frequency (TXIF) in, for example, a cellular telephone transmitter. This facilitates the integration of the QVCO 102 into an integrated circuit chip for reduced size, cost and power consumption as compared with prior art designs, while still meeting desired phase noise specification limits for the transmitted signal. In FIG. 2, the preferred form would be to incorporate elements (14, 22, 28, 48', 56, 102, 104 and 106) into an integrated circuit chip. The loop filter 60 may or may not be formed on the integrated circuit chip.

While the invention has been described with particular reference to the drawings, it should be understood that various modifications could be made without departing from the spirit and scope of the present invention.

What is claimed is:

1. A circuit for reducing phase noise in a transmitted radio signal comprising:
   a first phase-locked loop circuit including a first controlled oscillator generating a first output signal at a first desired frequency, and a first phase comparator developing a first phase error signal to control the first controlled oscillator, the first phase error signal being representative of phase differences between the first output signal and a reference signal;
   a second phase-locked loop circuit including a second controlled oscillator generating a second output signal at a desired frequency of transmission related to the first desired frequency, and a second phase comparator developing a second phase error signal representative of phase differences between the second output signal and the first output signal; and
   a summer combining the first and second error signals to control the second controlled oscillator to thereby reduce phase noise generated by the first controlled oscillator in the second output signal transmitted as a radio signal at the desired frequency of transmission.

2. The circuit of claim 1, further comprising a modulator modulating the first output signal with information to be transmitted.

3. The circuit of claim 2, wherein the modulated first output signal is input to the second phase comparator thereby transferring the modulated information to the second controlled oscillator.

4. The circuit of claim 1, further comprising a scaling circuit receiving the first error signal and developing a scaled version thereof, the scaled first error signal being input to said summer to be combined with said second error signal to reduce phase noise generated by the first controlled oscillator.

5. A circuit for reducing phase noise in a transmitted radio signal comprising:
   a first phase-locked loop circuit including a first controlled oscillator generating a first output signal at a first desired frequency, and first and second phase comparators each developing a phase error signal representative of phase differences between the first output signal and a reference signal, the phase error signal from the second phase comparator controlling the first controlled oscillator;
   a second phase-locked loop circuit including a second controlled oscillator generating a second output signal at a desired frequency of transmission related to the first desired frequency, and a third phase comparator developing a second phase error signal representative of phase differences between the second output signal and the first output signal; and
   a summer combining the error signal from said first phase comparator and the second error signal to control the second controlled oscillator thereby to reduce phase noise generated by the first controlled oscillator in the second output signal transmitted as a radio signal at the desired frequency of transmission.

6. The circuit of claim 5, further comprising a modulator modulating the first output signal with information to be transmitted.

7. The circuit of claim 6, wherein the modulated first output signal is input to the second phase comparator thereby transferring the modulated information to the second controlled oscillator.

8. The circuit of claim 5, wherein the summer comprises a node connecting the output of the first comparator with the output of the third comparator.

9. A method of reducing phase noise in a transmitted radio signal comprising the steps of:
   controlling a first controlled oscillator to generate a first output signal at a first desired frequency;
   developing a first phase error signal to control the first controlled oscillator, the first phase error signal representative of phase deviation of the first output signal from said first desired frequency;
   controlling a second controlled oscillator to generate a second output signal at a desired frequency of transmission related to the first desired frequency;
   developing a second phase error signal representative of phase differences between the second output signal and the first output signal; and
   combining the first and second phase error signals to control the second controlled oscillator to thereby reduce phase noise generated by the first controlled oscillator in the second output signal.

10. The method of claim 9, further comprising the step of modulating the first output signal with information to be transmitted.

11. The method of claim 10, wherein said modulating step is performed prior to developing the second phase error signal, whereby the modulated information is transferred to the second controlled oscillator.

12. The method of claim 9, wherein said combining step comprises the steps of:

scaling the first phase error signal; and adding the scaled first phase error signal to the second phase error signal.

13. The method of claim 9, further comprising the step of transmitting the second output signal as a radio signal at the desired frequency of transmission.

14. The method of claim 9, wherein the step of developing a first phase error signal comprises the step of developing substantially identical phase error signals representative of phase deviation of said first output signal from said first desired frequency, and wherein the step of combining the first and second phase error signals comprises the step of combining one of the identical phase error signals and the second phase error signal to reduce phase noise generated by the first controlled oscillator in the second output signal.

15. The method of claim 14, wherein said substantially identical phase error signals are relatively scaled to each other.

16. The method of claim 14, wherein said substantially identical phase error signals are developed at substantially identical first phase comparators, and the second phase error signal is developed at a second phase comparator, and wherein the step of combining one of the identical phase error signals and the second phase error signal comprises the step of connecting the output of one of the identical first phase comparators to the output of the second phase comparator.

17. The method of claim 16, wherein said substantially identical first phase comparators are scaled to produce relatively scaled output signals.

18. A circuit for reducing noise in a transmitted radio signal comprising:

a first phase-locked loop circuit receiving a reference signal at a reference frequency and developing a first output signal at a first desired frequency related to the reference frequency, said first phase-locked loop circuit including a first phase comparator circuit developing a first error signal representative of frequency and phase differences between the first output signal and the reference signal;

a second phase-locked loop circuit for receiving said first output signal, said reference signal, and said first error signal and developing a second output signal at a second desired frequency related to said reference frequency, the second phase-locked loop circuit including a second phase comparator circuit developing a second error signal representative of frequency and phase differences between the first output signal and the second output signal, and a summer combining the first and second error signals and developing a combined error signal to control the second phase-locked loop circuit to thereby reduce phase noise generated by the first phase-locked loop circuit in the second output signal transmitted as a radio signal at the second desired frequency.

19. The circuit of claim 18, wherein the first phase-locked loop circuit further includes a first loop filter receiving the first error signal from the first phase comparator circuit and developing a first control input signal, and a first controlled oscillator receiving the first control input signal and developing the first output signal as a frequency dependent on the first control input signal.

20. The circuit of claim 19, wherein the first phase comparator circuit comprises identical third and fourth phase comparators, each of the third and fourth comparators receiving the first output signal and the first reference signal and developing the first error signal representative of frequency and phase differences between the first output signal and the first reference signal, wherein the first error signal from the third phase comparator is received by the first loop filter and the first error signal from the fourth phase comparator is received by the second phase-locked loop circuit.

21. The circuit of claim 19, wherein the first phase-locked loop circuit further includes first and second frequency divider circuits receiving the first output signal and first reference signal, respectively, the first and second frequency divider circuits modifying the first output signal and the first reference signal to a first comparison frequency prior to being received by the first phase comparator circuit.

22. The circuit of claim 21, further comprising a scaler circuit scaling the first error signal by a factor N, where N is the divide-by factor of the first divider circuit, the scaled first error signal being received as the first error signal at the second phase-locked loop circuit.

23. The circuit of claim 18, wherein the second phase-locked loop circuit includes a second loop filter receiving the combined error signal from the summer and developing a second control input signal, and a second controlled oscillator receiving the second control input signal and developing the second output signal as a frequency dependent on the second control input signal.

24. The circuit of claim 23, further comprising a modulator modulating the first output signal with information to be transmitted, the modulated first output signal received as the first output signal at the second phase comparator.

25. The circuit of claim 24, wherein the modulator comprises a quadrature modulator.

26. The circuit of claim 18, further comprising:

a power amplifier amplifying the second output signal; and an antenna transmitting the amplified second output signal over the air.

27. The circuit of claim 18, wherein the first and second phase-locked loop circuits are part of an integrated circuit chip.

28. The circuit of claim 18, wherein the second desired frequency is a desired frequency of transmission.

29. A circuit for reducing oscillator noise in a transmitter comprising:

a first phase-locked loop circuit including a first controlled oscillator generating a first output signal at a first desired frequency dependent on a first control input signal, and a first phase comparator circuit developing a first error signal to control the first controlled oscillator, the first error signal representative of phase differences between the first output signal and a reference frequency signal;

a second phase-locked loop circuit including a second controlled oscillator generating a second output signal at a frequency of transmission dependent on a second control input signal, a second phase comparator circuit developing a second error signal representative of phase differences between the first output signal from the first controlled oscillator and a second reference frequency signal, and a summer adding the first and second error signals to develop the second control input signal to control the second controlled oscillator such that said frequency of transmission is equal to a desired frequency of transmission and thereby reducing phase noise generated by the first controlled oscillator in the second output signal transmitted as a radio signal at the desired frequency of transmission.

30. The circuit of claim 29, wherein the second phase-locked loop circuit further includes a downconverter receiving the first reference frequency signal and the second output signal and developing the second reference frequency signal.

31. The circuit of claim 29, further comprising a modulator modulating the first output signal with information to be transmitted, the modulated first output signal received as the first output signal at the second phase comparator.

32. The circuit of claim 31, wherein the modulator comprises a quadrature modulator.

33. The circuit of claim 29, wherein the first phase comparator circuit comprises identical third and fourth phase comparators each receiving the first output signal and the first reference frequency signal and developing the first error signal representative of frequency and phase differences between the first output signal and the first reference frequency signal, wherein the first error signal from the third phase comparator is received by a first loop filter developing the first input control signal in response thereto, and the first error signal from the fourth comparator is received by the summer.

* * * * *

UNITED STATES PATENT AND TRADEMARK OFFICE
CERTIFICATE OF CORRECTION

PATENT NO.   : 6,091,303
DATED        : July 18, 2000
INVENTOR(S)  : Paul W. Dent It is certified that error appears in the above-identified patent and that said Letters Patent is hereby corrected as shown below:

<u>Column 8,</u>
Line 35, "second phase comparator" should be -- third phase comparator --.

Signed and Sealed this

Thirtieth Day of July, 2002

*Attest:*

*Attesting Officer*

JAMES E. ROGAN
*Director of the United States Patent and Trademark Office*